US006627540B2

(12) United States Patent
Lee

(10) Patent No.: US 6,627,540 B2
(45) Date of Patent: Sep. 30, 2003

(54) METHOD FOR FORMING DUAL DAMASCENE STRUCTURE IN SEMICONDUCTOR DEVICE

(75) Inventor: Kyoung-woo Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/233,812

(22) Filed: Sep. 3, 2002

(65) Prior Publication Data

US 2003/0109132 A1 Jun. 12, 2003

(30) Foreign Application Priority Data

Dec. 7, 2001 (KR) ........................................ 2001-77457

(51) Int. Cl.⁷ .................... H01L 21/4763; H01L 21/302
(52) U.S. Cl. ...................... 438/638; 438/622; 438/623; 438/624; 438/634; 438/706; 438/740
(58) Field of Search ................... 438/637–640, 438/622–624, 634, 706, 707, 710, 738, 740

(56) References Cited

U.S. PATENT DOCUMENTS 6,025,259 A * 2/2000 Yu et al.
6,331,479 B1 * 12/2001 Li et al.

* cited by examiner

Primary Examiner—Ha Tran Nguyen
(74) Attorney, Agent, or Firm—Mills & Onello LLP

(57) ABSTRACT

A method for forming a dual damascene structure in a semiconductor device, which is capable of preventing defects in node segregation between damascene interconnections and reducing parasitic capacitance, is provided. The method includes sequentially depositing an insulating structure layer including a via level insulating layer and a trench level insulating layer and a hard mask layer on a semiconductor substrate on which an underlying layer including a contact plug is formed, forming a via hole on the via level insulating layer using the hard mask layer, add forming a trench connected to the via hole in the insulating structure layer using the hard mask layer. A predetermined upper portion of the insulating structure layer and the hard mask layer are removed when the trench and the via hole are formed.

17 Claims, 10 Drawing Sheets

METHOD FOR FORMING DUAL DAMASCENE STRUCTURE IN SEMICONDUCTOR DEVICE

BACKGROUND OF THE INVENTION

1. Field of the Invention

The present invention relates to a method for forming metal interconnections in a semiconductor device, and more particularly, to a method for forming a dual damascene structure in a low dielectric layer.

2. Description of the Related Art

To comply with the demand for highly integrated semiconductor devices, multilayered conductive layers are formed on a substrate, and the size of the multilayered conductive layer becomes smaller. If the multilayered conductive layer having a fine size is formed on the substrate, resistance and parasitic capacitance between layers increase, and thus resistance-capacitance (RC) delay occurs in devices.

In order to prevent RC delay, at the present, a low-K dielectric insulating layer is used as an interlevel dielectric (ILD) layer, and copper having low resistance is used as a metal interconnection material. As is well known, since it is difficult to directly etch a copper metal layer, a dual damascene process is used in the case where the copper metal layer is used for the interconnection.

Hereinafter, a conventional method for forming a dual damascene structure using a low dielectric insulating layer as an ILD layer will be described with reference to FIGS. 1A through 1F.

As shown in FIG. 1A, an underlying layer 10 including a contact plug 20 is formed on a semiconductor substrate 10 on which a semiconductor device is formed. An underlying hard mask layer 17 may be formed on the surface of the underlying layer 10. A barrier layer 22, a first organic polymer layer 25, an etch stopper 28, and a second organic polymer layer 30 are sequentially formed on the underlying hard mask layer 17 and the contact plug 20. Here, the first organic polymer layer 25 is a via level insulating layer in which a via hole is to be formed, and the second organic polymer layer 30 is a trench level insulating layer in which a trench is to be formed.

Subsequently, a first hard mask layer 33 and a second hard mask layer 35 are sequentially stacked on the second organic polymer layer 30. In such a case, the first and second hard mask layers 33 and 35 are provided as an etching mask for etching the first and second organic polymer layers 25 and 30.

As shown in FIG. 1B, a first photoresist pattern 38 for defining a trench is formed on the second hard mask layer 35. The second hard mask layer 35 is patterned in the form of the first photoresist pattern 38. Here, X1 denotes an interval between the first photoresist patterns 38 and becomes a line width of a predetermined trench.

As shown in FIG. 1C, the first photoresist pattern 38 is removed. A second photoresist pattern 40 is formed on the second and first hard mask layers 33 and 35. Here, an interval X2 between the second photoresist patterns 40 is narrower than the interval X1 between the first photoresist patterns 38 (see FIG. 1B) and may be preferably about the same as that of the contact plug 20. Here, the interval X2 becomes the diameter of a predetermined via hole. As a result, the second hard mask layer 35 becomes a mask for defining a trench, and the first hard mask layer 33 becomes a mask for defining a via hole. After that, the first hard mask layer 33 exposed by the second photoresist pattern 40 is etched.

Referring to FIG. 1D, the second photoresist pattern 40 is removed. The exposed second organic polymer layer 30 is patterned in the form of the first hard mask layer 33.

After that, as shown in FIG. 1E, an exposed etch stopper 28 is etched using the patterned second organic polymer layer 30 as a mask, and simultaneously the first hard mask layer 33 under the second hard mask layer 35 is etched in the form of the second hard mask layer 35. As a result, the etch stopper 28 has an interval of the diameter of a via hole, and the first and second hard mask layers 33 and 35 have intervals of the line width of a trench. After that, the exposed second organic polymer layer 30 is etched using the first and second hard mask layers 33 and 35 as a mask, and simultaneously the exposed first organic polymer layer 30 is etched using the etch stopper 28 as a mask. As a result, a trench t having the line width of the interval X1 is formed on the second organic polymer layer 30, and a via hole h, which is connected to the trench t and has the line width smaller than that of the trench t, is formed on the first organic polymer layer 25. As shown in FIG. 1F, the barrier layer 22 and the etch stopper 28, which are exposed by the via hole h and the trench t, respectively, are partially removed, thereby completing a dual damascene structure. When the barrier layer 22 and the etch stopper 28 are removed, the second hard mask layer 33 may be simultaneously removed. Here, for performing a subsequent CMP process, the first hard mask layer 33 must remain on the second organic polymer layer 30.

Although not shown, a copper metal layer is deposited on a semiconductor substrate structure so that the damascene structure is sufficiently buried, and then a chemical mechanical polishing (CMP) process is performed so that the first hard mask layer 33 is exposed, thereby forming a damascene metal interconnection.

However, in the conventional method for forming a dual damascene structure, an ILD layer in which the dual damascene structure is formed is formed as an organic polymer layer, resulting in the following problems.

In the prior art, since etching selectivity with respect to an organic polymer layer and a photoresist pattern is similar, a hard mask layer such as a silicon carbide (SiC) layer or a silicon oxide ($SiO_2$) layer, instead of a photoresist layer is used as a mask for etching the organic polymer layer. However, as shown in FIG. 1E, in the case where the first hard mask layer 33 is etched using the second hard mask layer 35, etching selectivity with respect to the first and second hard mask layers 33 and 35 is similar, parts of the second and first hard mask layers 35 and 33 may be lost. Likewise, if the parts of the second and first hard mask layers 35 and 33 are lost, a hard mask layer for etching the organic polymer layer may be transformed. As a result, if the second organic polymer layer 30 is etched using hard mask layers having a transformed shape, as shown in FIG. 2, the remaining first hard mask layer 33 and the second organic polymer layer 30 are transformed into a peak having incline. Thus, after a metal layer such as copper is buried in the trench t and the via hole h, the width of the remaining first hard mask layer 33 becomes very narrow during a CMP process, and thus a Cu metal layer having a damascene shape is not separated from another adjacent Cu metal layer having a damascene shape.

Also, in the prior art, since the organic polymer layer is used as an ILD layer, it is difficult to obtain the mechanical strength of the ILD layer during a subsequent CMP process. Further, since the dielectric constant of the organic polymer layer is low, it is difficult to easily disperse joule heat occurring when metal interconnection formed in the organic polymer layer electrically conducts.

Thus, a technique for forming a part of the ILD layer as a silicon oxide layer having a high dielectric constant has been suggested as another method according to the prior art and will be described with reference to FIGS. 3A through 3D.

As shown in FIG. 3A, an underlying layer 55 including a contact plug 60 is formed on a semiconductor substrate 50 on which a semiconductor device (not shown) is formed. An underlying hard mask layer 57 is formed on the surface of the underlying layer 55. A barrier layer 62, a silicon oxide layer 65, and an organic polymer layer 70 are sequentially formed on the underlying hard mask layer 57 and the contact plug 60. Here, the silicon oxide layer 65 becomes an ILD layer having a via level, and the organic polymer layer 70 becomes an insulating layer having a trench level. Next, a first hard mask layer 75 and a second hard mask layer 80 are sequentially stacked. In such a case, as described previously, a silicon carbide layer may be used as the first hard mask layer 75, and a silicon oxide layer may be used as the second hard mask layer 80. A first photoresist pattern (not shown) for defining a trench is formed on the second hard mask layer 80, and then the second hard mask layer 80 is etched in the form of the first photoresist pattern. Next, the first photoresist pattern is removed, and then a second photoresist pattern (not shown) for defining a via hole is formed on the second and first hard mask layers 80 and 75. Here, an interval between the second photoresist patterns is narrower than the interval between the first photoresist patterns and may be preferably about the same as that of the contact plug 60. The first hard mask layer 75 exposed by the second photoresist pattern is, etched. After that, the second photoresist pattern is removed.

As shown in FIG. 3B, the organic polymer layer 70 is etched using the first hard mask layer 75 as a mask.

After that, as shown in FIG. 3C, the first hard mask layer 75 is etched in the form of the second hard mask layer 80. Simultaneously, the silicon oxide layer 65 having a similar etching selectivity to that of the second hard mask layer 80 is also etched using the organic polymer layer 70 as a mask, thereby forming a via hole h.

As shown in FIG. 3D, the organic polymer layer 70 is etched in the form of the first and second hard mask layers 75 and 80 to form a trench t, thereby forming a dual damascene contact hole having the trench t and the via hole h. Next, the exposed barrier layer 62 is etched. In such a case, the second hard mask layer 80 is also simultaneously removed when the barrier layer 62 is etched.

Although not shown, a copper metal layer is deposited on a semiconductor substrate structure so that the damascene structure is sufficiently buried, and then a chemical mechanical polishing (CMP) process is performed so that the first hard mask layer 75 is exposed, thereby forming a damascene metal interconnection.

In the above method, the silicon oxide layer is used as a part of the ILD layer, thereby improving the mechanical strength of the ILD layer and the joule heat dispersion property. However, etching the silicon oxide layer 65 for forming the via hole h is performed simultaneously with etching the first hard mask layer 75 using the second hard mask layer 80 as a mask, and thus the second and first hard mask layers 80 and 75 are substantially lost. That is, as described above, there is a wide difference between the thickness of the silicon oxide layer 65 used as the ILD layer and the thickness of the second hard mask layer 80, and thus the second and first hard mask layers 80 and 75 are substantially lost when the silicon oxide layer 65 for forming a via hole is etched. In this way, if the hard mask layers are substantially lost, as described above, a Cu metal layer having a damascene shape is not separated from another adjacent Cu metal layer having a damascene shape.

In addition, the silicon oxide layer ($SiO_2$) having a high dielectric constant is used as the ILD layer, and thus the dielectric constant of the ILD layer increases, and parasitic capacitance may occur.

SUMMARY OF THE INVENTION

To solve the above problems, it is an object of the present invention to provide a method for forming a dual damascene structure in a semiconductor device, which is capable of preventing defects in node segregation between damascene interconnections and reducing parasitic capacitance.

According to one aspect of the present invention, there is provided a method for forming a dual damascene structure in a semiconductor device. An insulating structure layer including a via level insulating layer and a trench level insulating layer and a hard mask layer are deposited sequentially on a semiconductor substrate on which an underlying layer including a contact plug is formed. A via hole is formed on the via level insulating layer using the hard mask layer. A trench connected to the via hole is formed in the insulating structure layer using the hard mask layer. Here, a predetermined upper portion of the insulating structure layer and the hard mask layer are removed when the trench and the via hole are formed.

In one embodiment, the insulting structure layer further includes a trench level insulating layer, an etch stopper formed on the trench level insulating layer and a buffer insulating layer formed on the etch stopper, and the buffer insulating layer is removed when the trench is formed. Also, the trench level insulating layer and the buffer insulating layer are organic polymer layers.

According to another aspect of the present invention, there is provided a method for forming a dual damascene structure in a semiconductor device. A via level insulating layer, a trench level insulating layer, an etch stopper, a buffer insulating layer, a first hard mask layer, and a second hard mask layer are deposited sequentially on a semiconductor substrate on which an underlying layer including a contact plug is formed. The second hard mask layer is patterned to have a first interval, and the first hard mask layer is patterned to have a second interval narrower than the first interval. The buffer insulating layer is etched in the form of the first hard mask layer. The first hard mask layer is etched in the form of the second hard mask layer and simultaneously the etch stopper is etched in the form of the buffer insulating layer. The buffer insulating layer is etched again in the form of the second and first hard mask layers and simultaneously the trench level insulating layer is etched in the form of the etched etch stopper. A via hole is formed in the via level insulating layer by etching the via level insulating layer using the trench level insulating layer as a mask and simultaneously the etch stopper is etched again in the form of the buffer insulating layer. A trench is formed in the trench level insulating layer by etching the exposed trench level insulating layer by using the etch stopper as a mask. Here, when forming the via hole, the second and first hard mask layers are simultaneously removed, and when forming the trench, the buffer insulating layer is removed.

According to another aspect of the present invention, there is provided a method for forming a dual damascene structure in a semiconductor device. A via level insulating layer, a first organic polymer layer, an etch stopper, a second organic polymer layer, a first hard mask layer, and a second hard mask layer are deposited sequentially on a semiconductor substrate on which an underlying layer including a contact plug is formed. The second hard mask layer is patterned to have a first interval. The exposed first hard mask layer is patterned to have a second interval narrower than the first interval. The second organic polymer layer is etched in the form of the first hard mask layer. The first hard mask layer is etched in the form of the second hard mask layer and simultaneously the etch stopper is etched in the form of the etched second organic polymer layer. The second organic polymer layer is etched again in the form of the second and first hard mask layers and simultaneously the first organic polymer layer is etched by using the etch stopper as a mask. A via hole is formed in the via level insulating layer by etching the exposed via level insulating layer using the first organic polymer layer as a mask and simultaneously the etch stopper is etched again in the form of the etched second organic polymer layer. A trench is formed in the first organic polymer layer by etching the exposed first organic polymer layer using the etch stopper as a mask. Here, when forming the via hole, the second and first hard mask layers are simultaneously removed, and when forming the trench, the second organic polymer layer is removed, and the via level insulating layer is formed of a material selected from a SiOC:H layer, a SiOC layer, a HSQ layer, and porous silica.

Here, the etch stopper is formed of a silicon carbide layer, a silicon oxide layer, or a silicon nitride layer.

Also, the first and second hard mask layers are formed of materials having etching selectivity different from those of the first and second organic polymer layers and similar to that of the etch stopper.

Preferably, the first hard mask layer is formed of one of a silicon carbide layer, a silicon nitride layer, and a silicon oxide layer, and the second hard mask layer is formed of a silicon oxide layer in the case where the first hard mask layer is formed of a silicon carbide layer or a silicon nitride layer, and the second hard mask layer is formed of a silicon carbide layer or, a silicon nitride layer in the case where the first hard mask layer is formed of a silicon oxide layer.

Furthermore, the first interval is the diameter of the via hole, and the second interval is the line width of the trench.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1A:
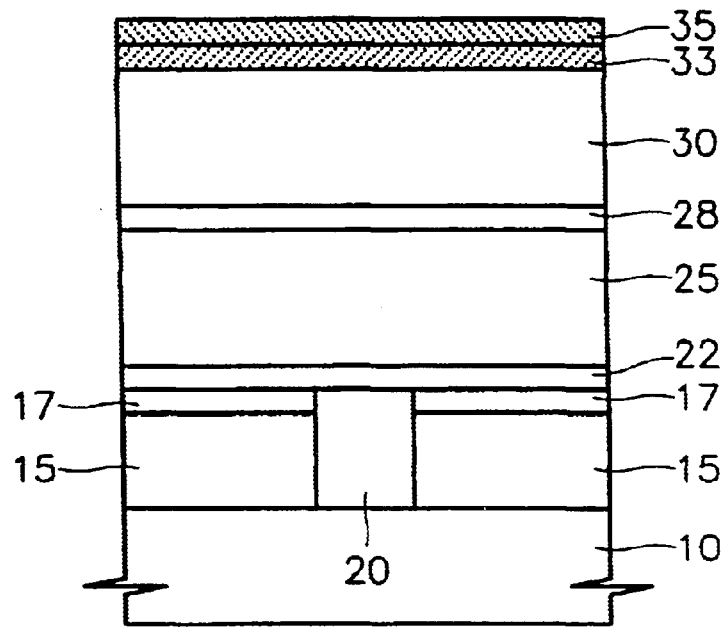
FIGS. 1A through 1F are cross-sectional views illustrating a conventional method for forming a dual damascene structure in a semiconductor device according to a first technique of the prior art.
Figure 1B:
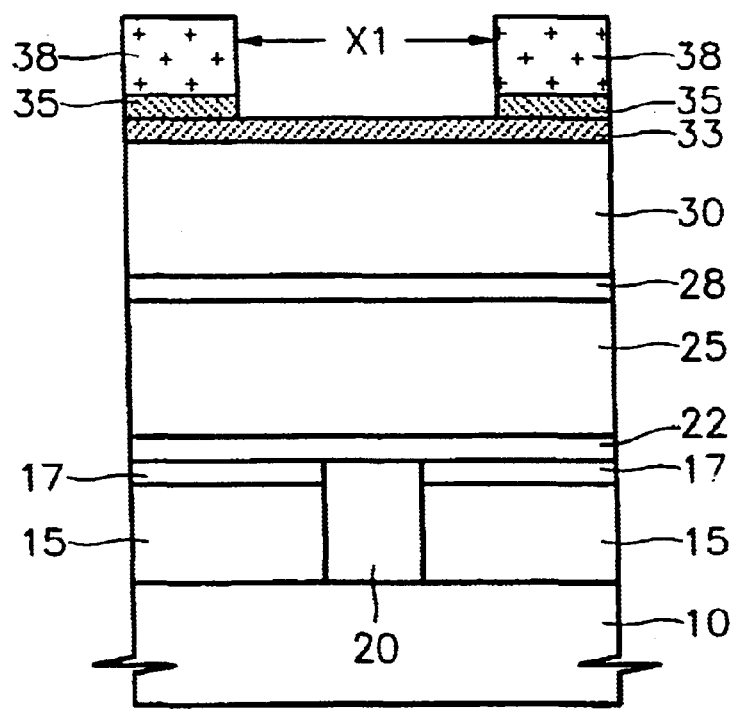
Figure 1C:
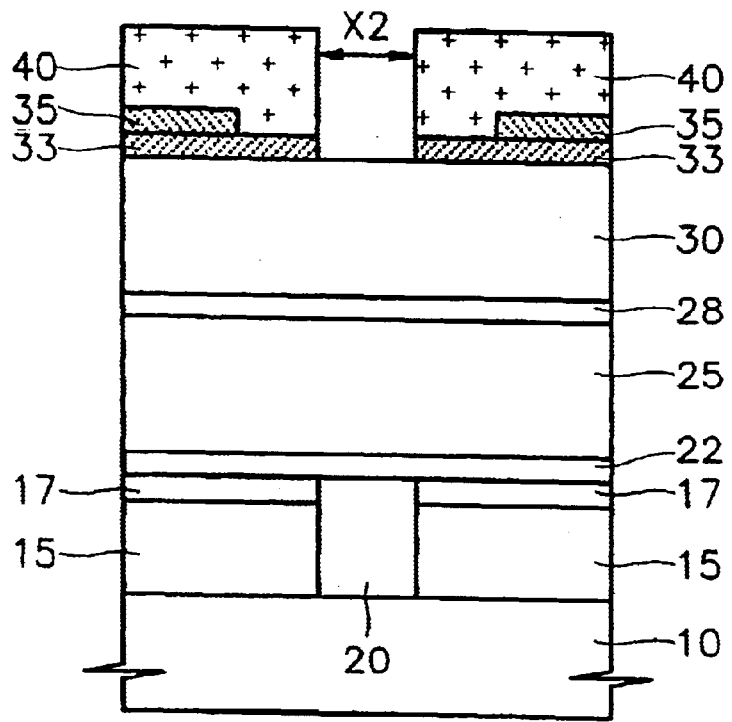
Figure 1D:
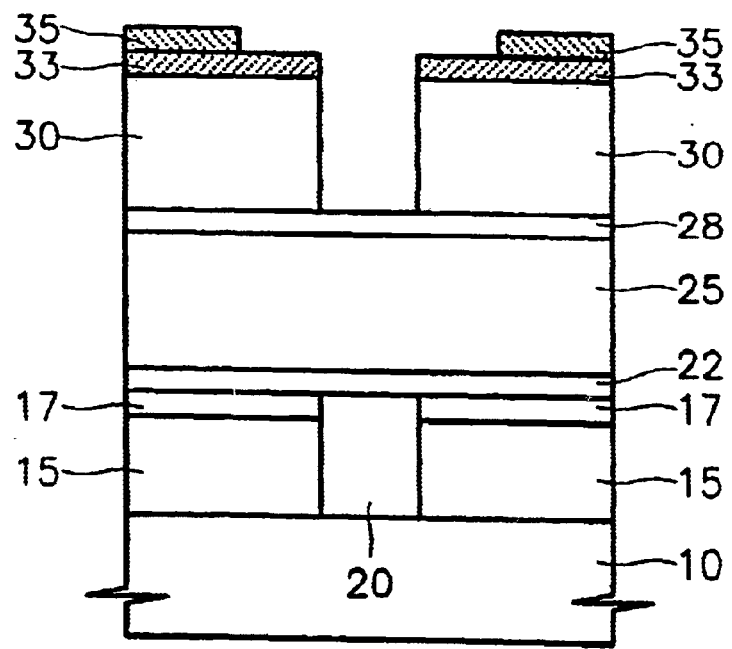
Figure 1E:
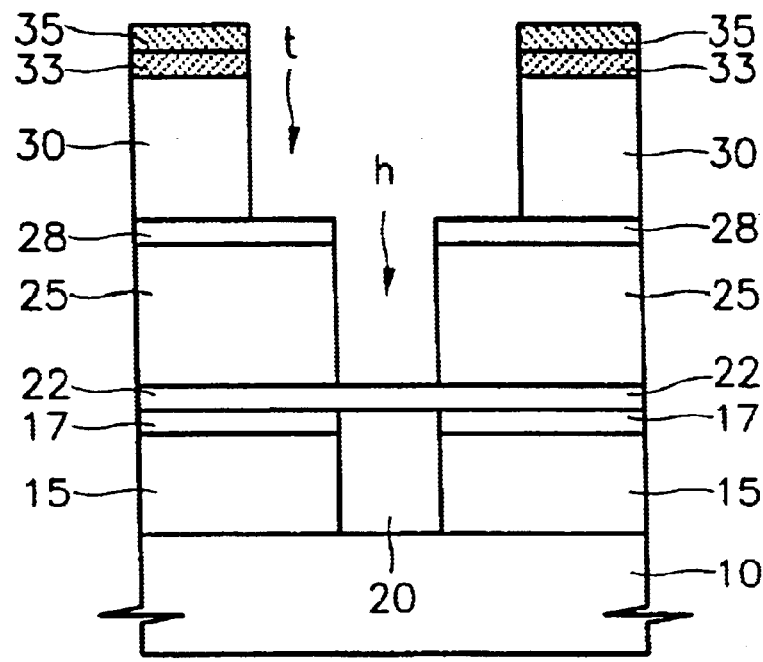
Figure 1F:
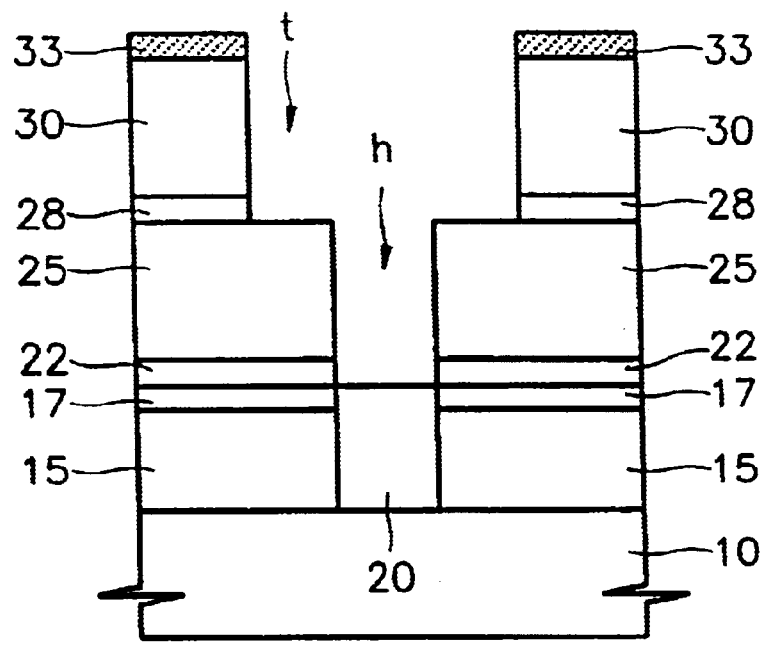
Figure 2:
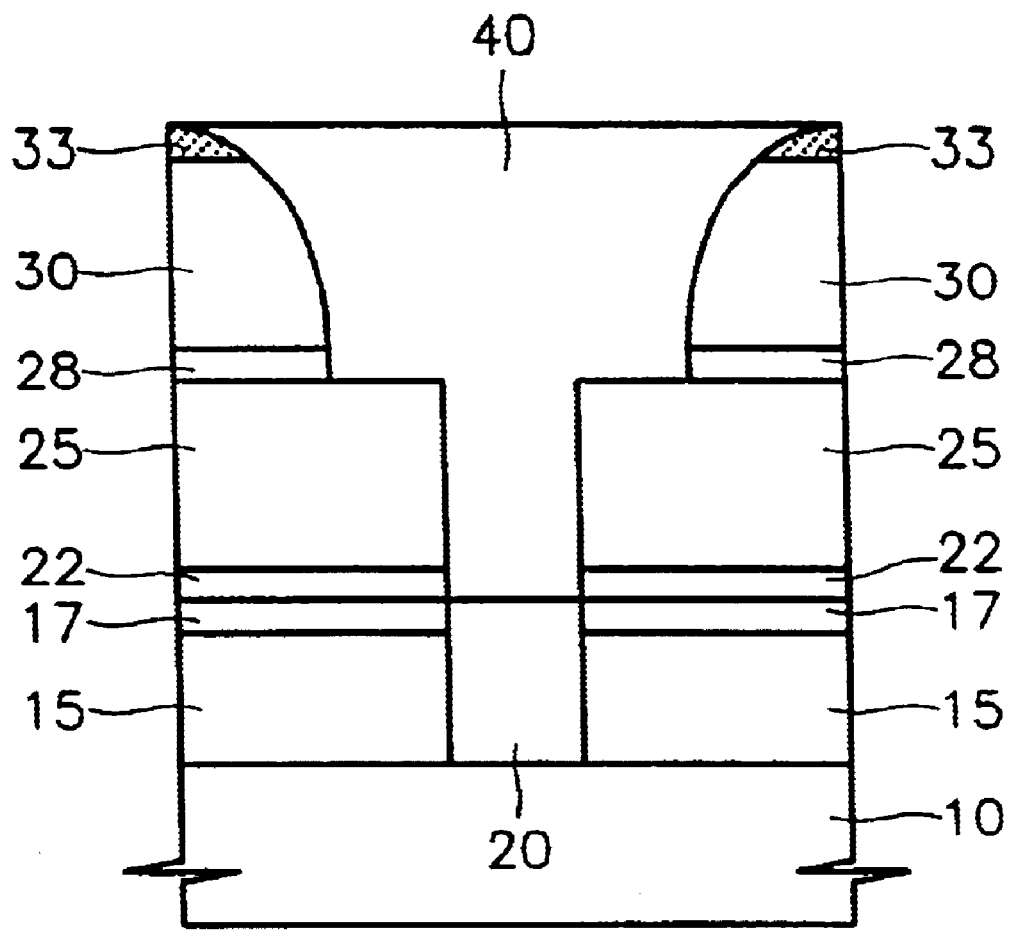
FIG. 2 is a cross-sectional view illustrating drawbacks of the first technique of the prior art.
Figure 3A:
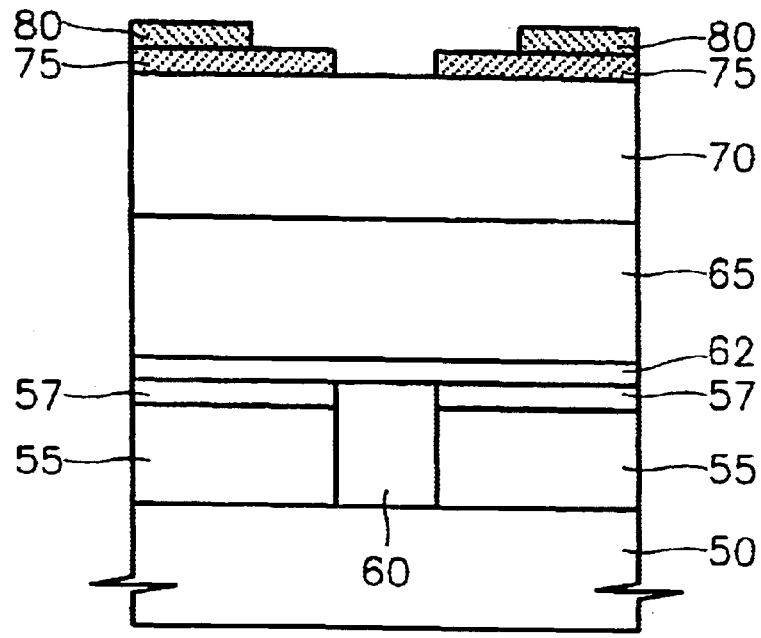
FIGS. 3A through 3D are cross-sectional views illustrating a conventional method for forming a dual damascene structure in a semiconductor device according to a second technique of the prior art.
Figure 3B:
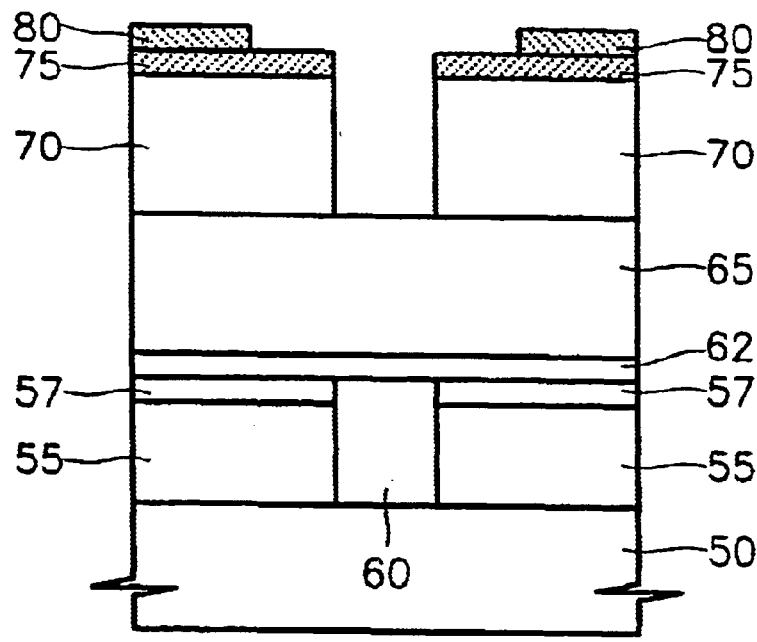
Figure 3C:
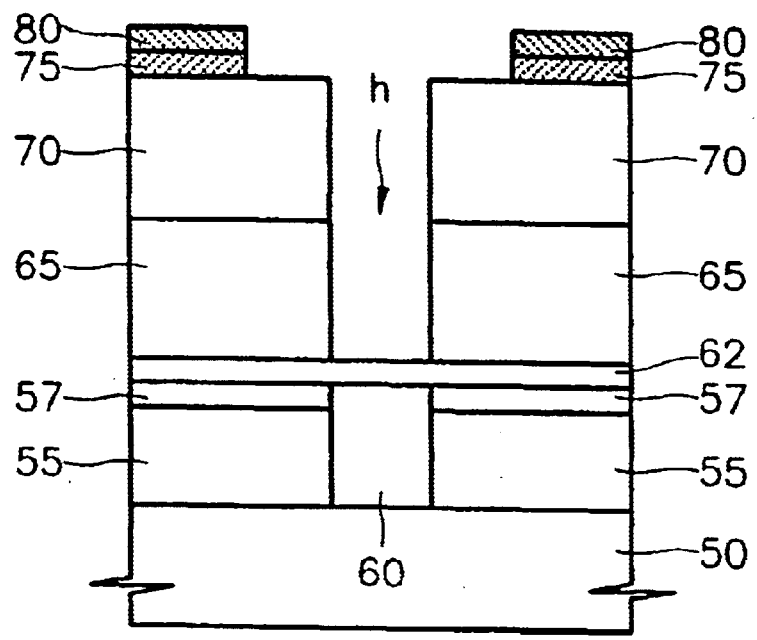
Figure 3D:
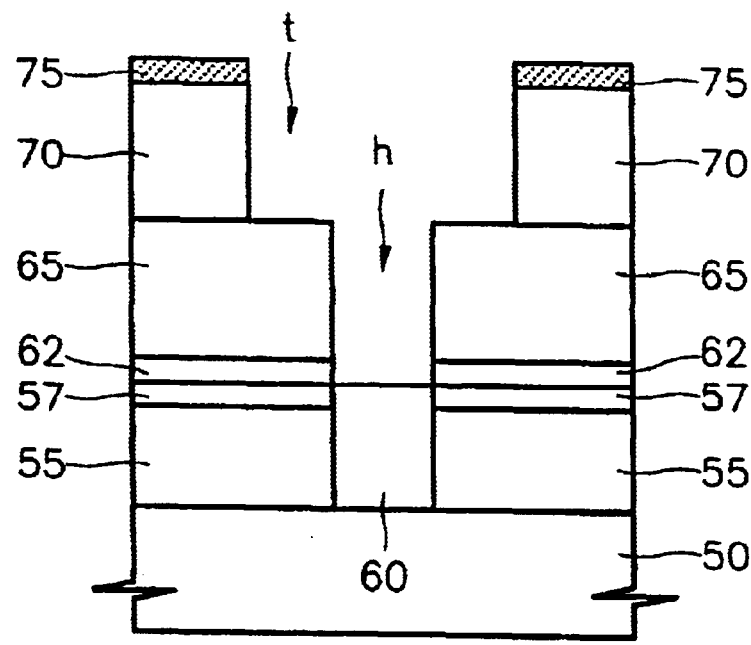

The present invention will be described more fully hereinafter with reference to the accompanying drawings in which preferred embodiments of the invention are shown. This invention may, however, be embodied in many different forms and should not be construed as being limited to the embodiments set forth herein. In the drawings, the forms of elements are exaggerated for clarity. It will be understood that when a layer is referred to as being on another layer or "on" a semiconductor substrate, it can be directly on the other layer or on the semiconductor substrate, or intervening layers may also be present.

FIGS. 4A through 4H are cross-sectional views illustrating a method for forming a dual damascene structure in a semiconductor device according to a preferred embodiment of the present invention.

Figure 4A:
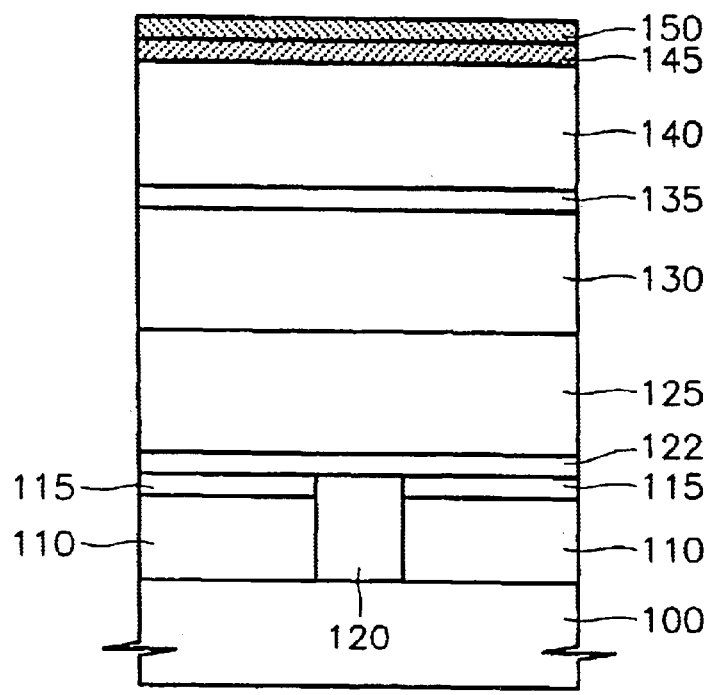
FIGS. 4A through 4H are cross-sectional views illustrating a method for forming a dual damascene structure in a semiconductor device according to an embodiment of the present invention.

As shown in FIG. 4A, an underlying layer 110 is formed on a semiconductor substrate 100 on which semiconductor devices (not shown) are formed. The underlying layer 110 may be a silicon oxide layer or an organic polymer layer. By a well-known method, an underlying hard mask layer 115 is formed on the underlying layer 110, and a contact plug 120 is formed in the underlying layer 110 and the underlying hard mask layer 115. Here, the contact plug 120 may be, for example, a copper (Cu) plug. A barrier layer 122 is formed on the contact plug 120 and the underlying hard mask layer 115. For example, a silicon carbide layer, may be used as the barrier layer 122. A via level insulating layer having a dielectric constant lower than that of a silicon oxide layer, and high mechanical strength and high heat transfer property, such as a SIOC:H layer, SiCO layer, HSQ layer or porous silica, is used as an insulating layer on the barrier layer 122. In one embodiment, a SiOC:H layer 120 is used as the via level insulating layer. A first organic polymer layer 130, an etch stopper 135, and a second organic polymer layer 140 are sequentially formed on a SiOC:H layer 125. Here, the first and second organic polymer layers 130 and 140 have etching selectivity similar to that of photoresist. A silicon carbide layer, a silicon oxide layer or a silicon nitride layer, which has high etching selectivity with respect to the first and second organic polymer layers 130 and 140, is used as the etch stopper 135. After that, a first hard mask layer 145 and a second hard mask layer 150 are sequentially formed on the second organic polymer layer 140. Here, the first hard mask layer 145 may be formed of a silicon carbide layer, a silicon nitride layer, or a silicon oxide layer, and the second hard mask layer 150 may be formed of a silicon oxide layer in the case where the first hard mask layer 145 is formed of a silicon carbide layer or a silicon nitride layer. Also, the second hard mask layer 150 may be formed of a silicon carbide layer and a silicon nitride layer in the case where the first hard mask layer 145 is formed of a silicon oxide layer.

Figure 4B:
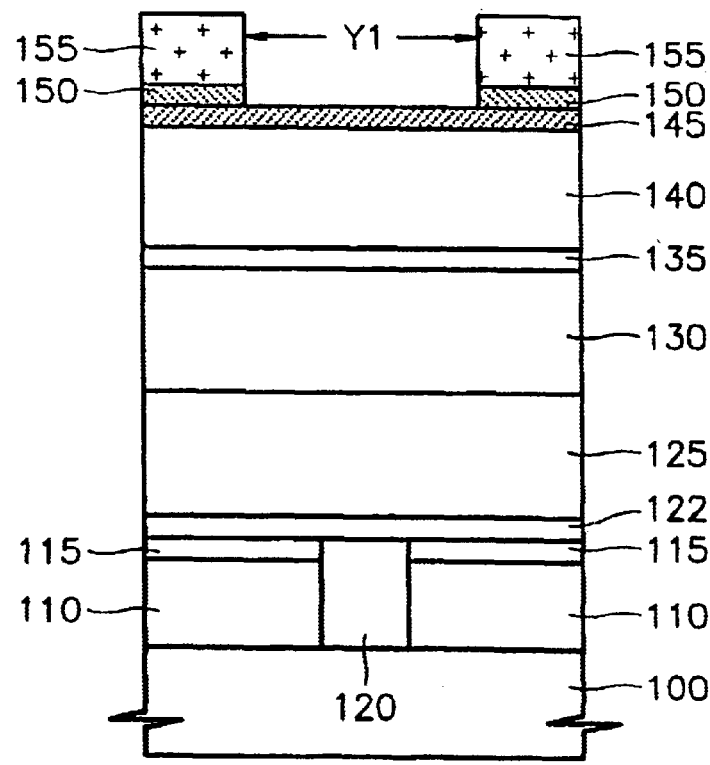

As shown in FIG. 4B, a first photoresist pattern 155 is formed on the second hard mask layer 150. In such a case, the first photoresist pattern 155 is a mask for defining a trench region of a damascene structure and has an interval, for example, of Y1. Here, the interval Y1 becomes the line width of a trench. After that, the exposed second hard mask layer 150 is etched using the first photoresist pattern 155 as a mask.

Figure 4C:
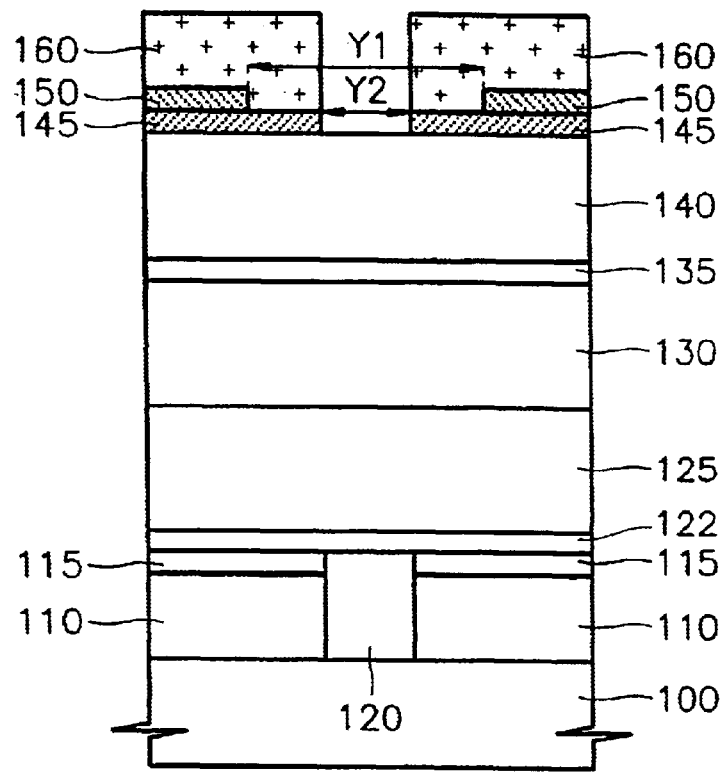

As shown in FIG. 4C, the first photoresist pattern 155 is removed, and then a second photoresist pattern 160 is formed in a predetermined upper portion of the exposed first and second hard mask layers 145 and 150. The second photoresist pattern 160 is a mask for defining a via hole region of a damascene structure and has an interval, for example, of Y2 narrower than the interval Y1 of the second hard mask layer 150. Here, the interval Y2 becomes the diameter of a via hole, which is to be formed.

Figure 4D:
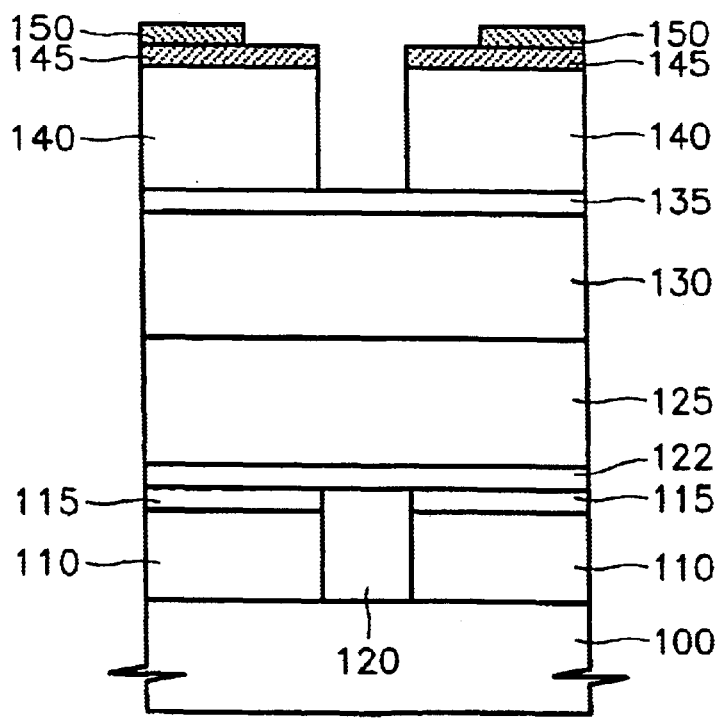

As shown in FIG. 4D, the second photoresist pattern 160 is removed. After that, the second organic polymer layer 140 is etched using the first hard mask layer 145 having the interval of Y2 as a mask. As a result, a hole having the line width of the via hole is formed in the second organic polymer layer 140. The second organic polymer layer 140 may be etched by an oxygen-containing gas, for example, $N_2O_2$ gas. Also, a predetermined portion of the etch stopper 135 is exposed through etching of the second organic polymer layer 140.

Figure 4E:
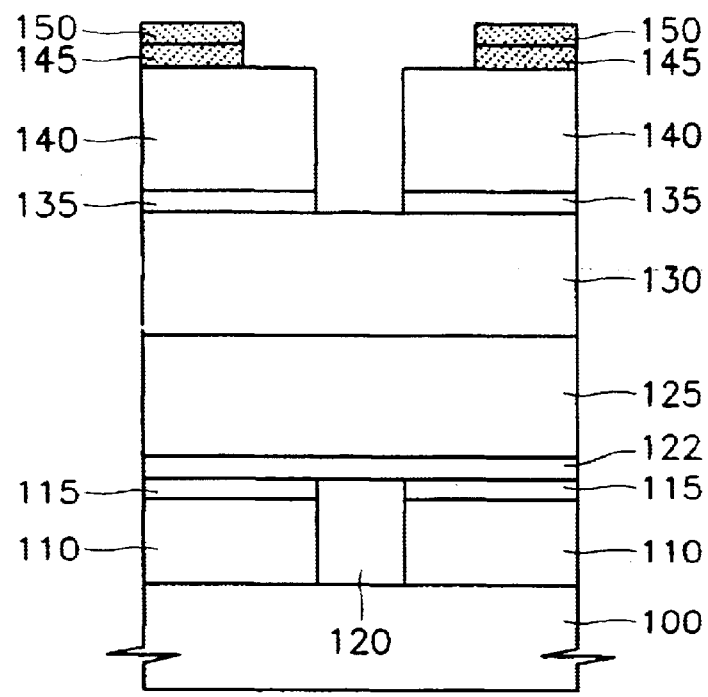

Referring to FIG. 4E, the exposed first hard mask layer 145 is etched using the second hard mask layer 150 as a mask. In such a case, the etch stopper 135 and the first hard mask layer 145 have similar etching selectivity. Therefore, the exposed etch stopper 135 is also etched simultaneously with etching of the first hard mask layer 145, by using the patterned second organic polymer layer 140 as a mask. As a result, the first and second hard mask layers 145 and 150 are apart from the line width of the trench, and the etch stopper 135 is apart from the line width of the via hole.

Figure 4F:
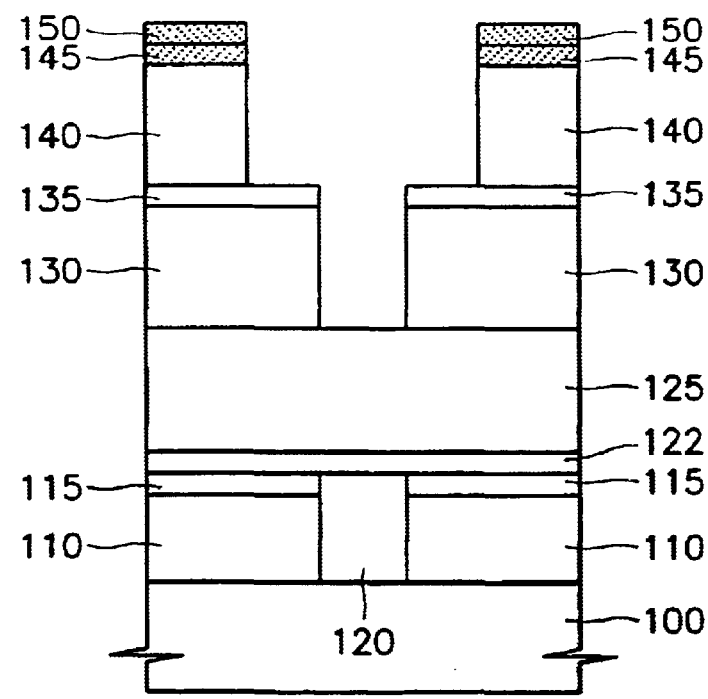

As shown in FIG. 4F, the second organic polymer layer 140 is again etched using the first and second hard mask layers 145 and 150 as a mask. Simultaneously, the first organic polymer layer 130 is etched by the etch stopper 135. As a result, a hole having the line width of the trench is formed in the second organic polymer layer 140, and a hole having the line width of the via hole is formed in the first organic polymer layer 130. In such a case, the first and second organic polymer layers 130 and 140 have the same etching selectivity, and thus the above process may be simultaneously performed.

Figure 4G:
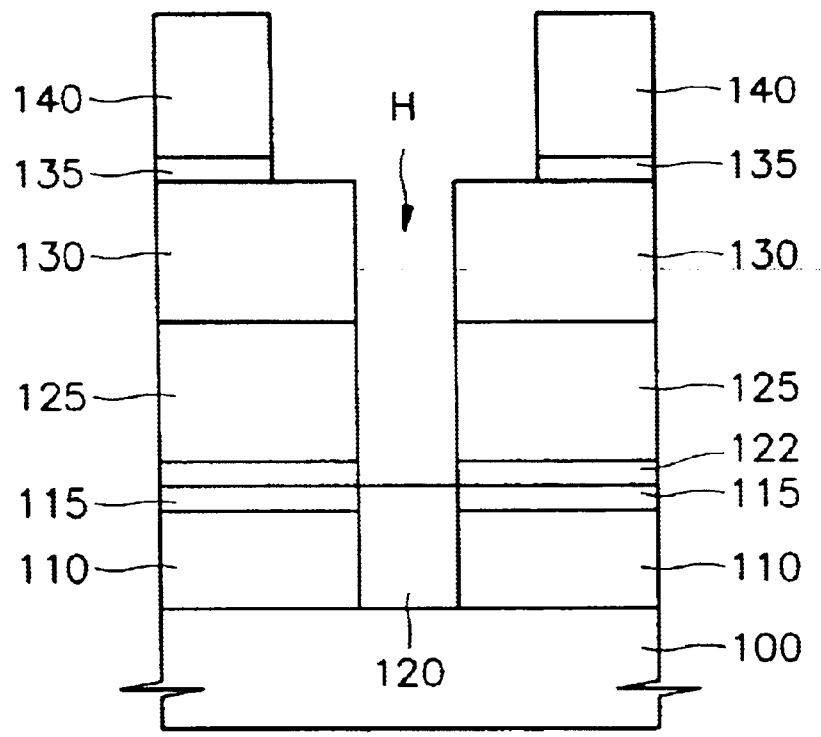
Figure 4H:
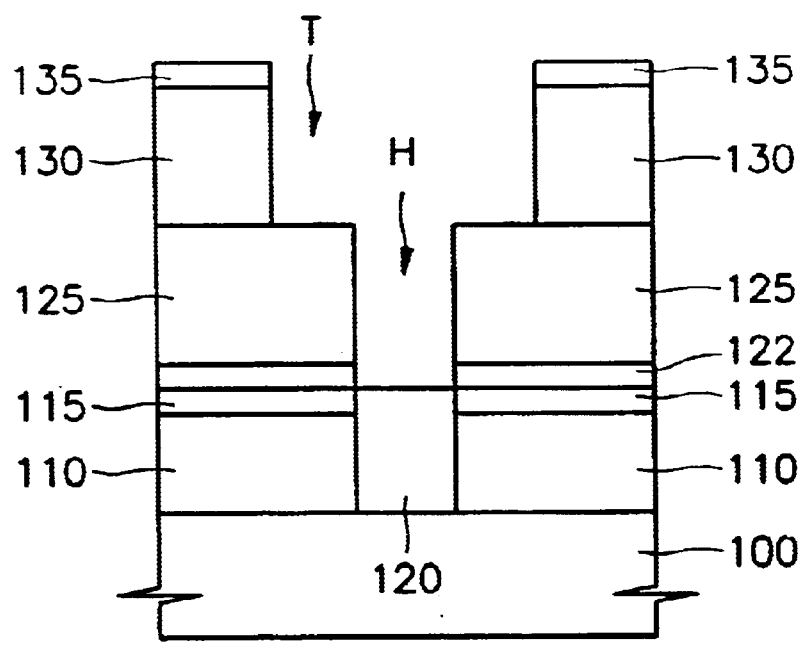

Referring to FIG. 4G, the exposed SiOC:H layer 125 and the barrier layer 122 are etched using the first organic polymer layer 130 as a mask, thereby forming a via hole H in the SiOC:H layer 125. In the above procedure, the first and second hard mask layers 145 and 150 having etching selectivity similar to the SiOC:H layer 125 and the etch stopper 135 exposed by the second organic polymer layer 140 are etched simultaneously with etching of the SiOC:H layer 125 and the barrier layer 122. Thus, the first and second hard mask layers 145 and 150 are removed, and the etch stopper 135 remains on the second organic polymer layer 140 in the form of the second organic polymer layer 140 having the hole of the line width of the trench. As shown in FIG. 4H, the first organic polymer layer 130 is etched in the form of the etch stopper 135, thereby forming a trench T in the first organic polymer layer 130. Since the second organic polymer layer 140 on the etch stopper 135 is exposed to an etching gas when the first organic polymer layer 130 is etched, the second organic polymer layer 140 is removed simultaneously with etching of the first organic polymer layer 130, thereby forming a dual damascene structure having the trench T and the via hole H.

Although not shown, a copper metal layer is formed so that the damascene structure is sufficiently buried, and a chemical mechanical polishing (CMP) process is performed until the etch stopper is exposed, thereby forming a damascene metal interconnection.

In one embodiment, by using the second hard mask layer 150, parts of the second and first hard mask layers 150 and 140 are lost when the first hard mask layer 145 is etched, thereby the remaining first hard mask layer 145 and the second organic polymer layer 140 can have a peak shape. However, the first hard mask layer 145 and the second organic polymer layer 140 having the peak shape are removed in a subsequent process, and thus do not affect a subsequent CMP process.

Further, in one embodiment, a SiOC:H layer having high mechanical strength and high heat transfer property is formed as an ILD layer in which a via hole having a damascene is formed. Thus, during the subsequent CMP process, the mechanical strength of the ILD layer is enhanced, and joule heat is easily dispersed when the damascene metal interconnection electrically conducts, and due to a low dielectric constant, parasitic capacitance can be reduced.

As described above, according to the present invention, the hard mask layers having a transformed shape and the second organic polymer layer are removed during a process of forming a trench, thereby preventing defects in node segregation. Further, the SiOC:H layer is formed as the ILD layer corresponding to the via level of the dual damascene structure, thereby reducing parasitic capacitance and improving the mechanical strength and heat conductivity of the ILD layer.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A method for forming a dual damascene structure in a semiconductor device, the method comprising:

depositing an insulating structure layer including a via level insulating layer, a trench level insulating layer over the via level insulating layer, an etch stopper formed on the trench level insulating layer, a buffer insulating layer formed on the etch stopper and a hard mask layer over the buffer insulating layer on a semiconductor substrate on which an underlying layer including a contact plug is formed, the hard mask layer including a first hard mask sublayer and a second hard mask sublayer formed over the first mask sublayer;

after the first and second hard mask sublayers are formed, patterning the second hard mask sublayer to have a first opening having a first width;

patterning the first hard mask sublayer to have a second opening having a second width;

forming a via hole on the via level insulating layer using the first hard mask sublayer as a mask during formation of the via hole, extending the via hole through the via level insulating layer; and forming a trench connected to the via extended hole in the insulating structure layer using the second hard mask sublayer as a mask during formation of the trench wherein the buffer insulating layer is removed when the trench is formed;

wherein a predetermined upper portion of the insulating structure layer and the hard mask layer are removed when the trench and the via hole are formed.

2. The method of claim 1, wherein the via level insulating layer is formed of a material selected from a SiOC:H layer, a SiOC layer, a HSQ layer, and porous silica.

3. The method of claim 1, wherein the trench level insulating layer and the buffer insulating layer are organic polymer layers.

4. The method of claim 1, wherein the hard mask layer is formed of a material selected from a silicon carbide layer, a silicon oxide layer, and a silicon nitride layer.

5. A method for forming a dual damascene structure in a semiconductor device, the method comprising:
   (a) sequentially depositing a via level insulating layer, a trench level insulating layer, an etch stopper, a buffer insulating layer, a first hard mask layer, and a second hard mask layer on a semiconductor substrate on which an underlying layer including a contact plug is formed;
   (b) patterning the second hard mask layer to have a first interval;
   (c) patterning the first hard mask layer to have a second interval narrower than the first interval;
   (d) etching the buffer insulating layer in the form of.the patterned first hard mask layer;
   (e) etching the first hard mask layer in the form of the patterned second hard mask layer and simultaneously etching the etch stopper in the form of the etched buffer insulating layer;
   (f) again etching the buffer insulating layer in the form of the patterned second and first hard mask layers and simultaneously etching the trench level insulating layer in the form of the etched etch stopper;
   (g) forming a via hole in the via level insulating layer by etching the via level insulating layer using the trench level insulating layer as a mask and simultaneously again etching the etch stopper in the form of the etched buffer insulating layer; and
   (h) forming a trench in the trench level insulating layer by etching an exposed portion of the trench level insulating layer using the etch stopper as a mask;
   wherein, in step (g), the second and first hard mask layers are simultaneously removed, and in step (h), the buffer insulating layer is removed.

6. The method of claim 5, wherein the via level insulating layer is an insulating layer having high etching selectivity with respect to the organic polymer layers and a dielectric constant lower than that of a silicon oxide layer.

7. The method of claim 5, wherein the via level insulating layer is formed of a material selected from a SiOC:H layer, a SiOC layer, a HSQ layer, and porous silica.

8. The method of claim 5, wherein the etch stopper is formed of at least one of a silicon carbide layer, a silicon oxide layer, and a silicon nitride layer.

9. The method of claim 5, wherein the trench level insulating layer and the buffer insulating layer are organic polymer layers.

10. The method of claim 5, wherein the first and second hard mask layers are formed of materials having etching selectivity different from those of the buffer insulating layer and the trench level insulating layer and similar to that of the etch stopper.

11. The method of claim 8, wherein:
   the first hard mask layer is formed of one of a silicon carbide layer, a silicon nitride layer, and a silicon oxide layer,
   the second hard mask layer is formed of a silicon oxide layer in the case where the first hard mask layer is formed of a silicon carbide layer or a silicon nitride layer, and
   the second hard mask layer is formed of one of a silicon carbide layer and a silicon nitride layer in the case where the first hard mask layer is formed of a silicon oxide layer.

12. The method of claim 5, wherein the first interval is the diameter of the via hole, and the second interval is the line width of the trench.

13. A method for forming a dual damascene structure in a semiconductor device, the method comprising:
   (a) sequentially depositing a via level insulating layer, a first organic polymer layer, an etch stopper, a second organic polymer layer, a first hard mask layer, and a second hard mask layer on a semiconductor substrate on which an underlying layer including a contact plug is formed;
   (b) patterning the second hard mask layer to have a first interval;
   (c) patterning an exposed portion of the first hard mask layer to have a second interval narrower than the first interval;
   (d) etching the second organic polymer layer in the form of the patterned first hard mask layer;
   (e) etching the first hard mask layer in the form of the patterned second hard mask layer and simultaneously etching the etch stopper in the form of the etched second organic polymer layer;
   (f) again etching the second organic polymer layer in the form of the patterned second and first hard mask layers and simultaneously etching the first organic polymer layer by using the etch stopper as a mask;
   (g) forming a via hole in the via level insulating layer by etching an exposed portion of the via level insulating layer using the first organic polymer layer as a mask and simultaneously again etching the etch stopper in the form of the etched second organic polymer layer; and
   (h) forming a trench in the first organic polymer layer by etching an exposed portion of the first organic polymer layer using the etch stopper as a mask;
   wherein, in step (g), the second and first hard mask layers are simultaneously removed, and in step (h), the second organic polymer layer is removed, and the via level insulating layer is formed of a material selected from a SiOC:H layer, a SiOC layer, a HSQ layer, and porous silica.

14. The method of claim 13, wherein the etch stopper is formed of at least one of a silicon carbide layer, a silicon oxide layer, and a silicon nitride layer.

15. The method of claim 14, wherein the first and second hard mask layers are formed of materials having etching selectivity different from those of the first and second organic polymer layers and similar to that of the etch stopper.

16. The method of claim 13, wherein:
   the first hard mask layer is formed of one of a silicon carbide layer, a silicon nitride layer, and a silicon oxide layer,
   the second hard mask layer is formed of a silicon oxide layer in a case where the first hard mask layer is formed of a silicon carbide layer or a silicon nitride layer, and
   the second hard mask layer is formed of one of a silicon carbide layer and a silicon nitride layer in the case where the first hard mask layer is formed of a silicon oxide layer.

17. The method of claim 13, wherein the first interval is the diameter of the via hole, and the second interval is the line width of the trench.

* * * * *

UNITED STATES PATENT AND TRADEMARK OFFICE
CERTIFICATE OF CORRECTION

PATENT NO. : 6,627,540 B2
DATED : September 30, 2003
INVENTOR(S) : Kyoung-woo Lee It is certified that error appears in the above-identified patent and that said Letters Patent is hereby corrected as shown below:

<u>Column 8,</u>
Line 40, please insert -- and -- before "a".
Line 56, please delete "extended".
Line 56, please insert -- extended -- before "via".

Signed and Sealed this

Second Day of March, 2004

JON W. DUDAS
*Acting Director of the United States Patent and Trademark Office*